US007985616B1

(12) United States Patent
Sutardja et al.

(10) Patent No.: US 7,985,616 B1
(45) Date of Patent: Jul. 26, 2011

(54) METHODS TO FORM WIDE HEATER TRENCHES AND TO FORM MEMORY CELLS TO ENGAGE HEATERS

(75) Inventors: Pantas Sutardja, Los Gatos, CA (US); Albert Wu, Palo Alto, CA (US); Chien-Chuan Wei, Sunnyvale, CA (US); Runzi Chang, Santa Clara, CA (US); Winston Lee, Palo Alto, CA (US); Peter Lee, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 554 days.

(21) Appl. No.: 12/060,810

(22) Filed: Apr. 1, 2008

Related U.S. Application Data

(60) Provisional application No. 60/910,240, filed on Apr. 5, 2007, provisional application No. 60/910,389, filed on Apr. 5, 2007.

(51) Int. Cl.
*H01L 21/00* (2006.01)

(52) U.S. Cl. ... 438/95; 438/330; 438/382; 257/E21.068; 257/E21.645

(58) Field of Classification Search .................... 438/95, 438/330, 382; 257/E21.068, E21.069, E21.35, 257/E21.645
See application file for complete search history.

(56) References Cited

U.S. PATENT DOCUMENTS

2005/0001284 A1* 1/2005 Pellizzer ....................... 257/528
2006/0073652 A1* 4/2006 Pellizzer et al. .............. 438/201
2008/0135824 A1* 6/2008 Lai et al. ........................... 257/2

* cited by examiner

*Primary Examiner* — Asok K Sarkar
*Assistant Examiner* — Julia Slutsker

(57) ABSTRACT

Embodiments of the present invention provide a method that includes providing a wafer including multiple cells, each cell including at least one emitter, and performing a lithographic operation on the wafer. The lithographic operation comprises forming heater trenches adjacent the emitters, each heater trench having a width that extends over at least respective portions of two cells. Other embodiments are also described.

11 Claims, 6 Drawing Sheets

METHODS TO FORM WIDE HEATER TRENCHES AND TO FORM MEMORY CELLS TO ENGAGE HEATERS

CROSS REFERENCE TO RELATED APPLICATIONS

The present application claims priority to U.S. Patent Application No. 60/910,240, filed Apr. 5, 2007, entitled "Wide Trench PCM to Heater Contact dx dy," and U.S. Patent Application No. 60/910,389, filed Apr. 5, 2007, entitled "Wide Trench PCM Heater dx dy," the entire specifications of which are hereby incorporated by reference in their entirety for all purposes, except for those sections, if any, that are inconsistent with this specification.

TECHNICAL FIELD

Embodiments of the present invention relate to the field of electronic memory devices, and more particularly, to phase change material (PCM) memory devices and methods for fabricating thereof.

BACKGROUND

Memory cells of electronic memory devices such as dynamic random access memory typically employ a number of electronic components in order to save data. For instance, in order to store data, a combination of electronic components such as transistors, diodes, and/or capacitors are typically employed in such memory cells to store or not store electrical charges. If a charge is stored in such a memory cell, that may indicate a logic "1," and if no charge is stored in such a memory cell that may indicate a logic "0."

An alternative approach for storing data is to use memory cells made of phase change material (PCM). A PCM is a material that can be placed into at least two physical states, a crystalline state and an amorphous state, by increasing or decreasing temperature. By changing the physical state of the PCM, certain characteristics of the material, such as electrical resistance, may also change. Such properties may be exploited in order to form memory cells made of PCM (herein "PCM cells").

Such memory cells are generally intricate and expensive to manufacture. Thus, it is important to manufacture them in such a way to ensure accuracy and reliability such that few memory cells are wasted. One concern involves the contact between a heater element and the PCM. Since it is undesirable to heat up the PCM, it is desirable to have a small contact between the PCM and the heater element. It is also desirable to manufacture the cells in such a way that ensures quality but that is also efficient and economical.

SUMMARY

In accordance with various embodiments of the present invention, a method includes providing a wafer including multiple cells, each cell including at least one emitter, and performing a lithographic operation on the wafer. The lithographic operation comprises forming heater trenches adjacent the emitters, each heater trench having a width that extends over at least respective portions of two cells.

In accordance with various embodiments, the lithographic operation is performed in a word-line direction across the wafer. In accordance with other embodiments, the lithographic operation is performed in a bit-line direction across the wafer.

In accordance with various embodiments, the lithographic operation further comprises depositing a heater alloy layer within each heater trench and depositing a nitride layer over the heater alloy layer. The lithographic operation also includes performing an anisotropic etching of the nitride layer and the heater alloy layer and depositing an oxide layer over the nitride layer to form a pre-heater element arrangement within each heater trench.

In accordance with various embodiments, the method further includes performing another lithographic operation across the wafer across the pre-heater arrangements to form two heater elements within each heater trench.

In accordance with various embodiments, the method further comprises performing a third lithographic operation comprising depositing a nitride layer over the heater elements and etching trenches within the second nitride layer, depositing germanium antimony tellurium (GST) material within the trenches and performing an anisotropic etching of the GST material.

In accordance with various embodiments, each trench has a width that extends over at least a portion of one cell. In accordance with other embodiments, each trench has a width that extends over at least a portion of two cells.

In accordance with various embodiments, the method further comprises forming a top emitter interface on the GST material for at least one emitter.

In accordance with various embodiments, the method further comprises performing a metallization such that a metal protective layer is provided on a top surface of the top emitter interface. In accordance with such embodiments, the metallization may be performed with tungsten.

In accordance with various embodiments, each heater element comprises one of TiN or TaN.

In accordance with various embodiments of the present invention, a method comprises providing a wafer comprising multiple cells, where each cell comprises a heater element and a nitride layer over the heater element. The method further comprises forming a trench within the nitride layer, where the trench has a depth such that a portion of the heater element is exposed. The method further comprises depositing GST material within the trench and performing an anisotropic etch of the GST material to form a memory cell adjacent to the portion.

In accordance with various embodiments, the trench has a width that extends over at least a portion of one cell. In accordance with other embodiments, the trench has a width that extends over at least respective portions of two cells and has a depth such that the portion of the respective heater element of the two cells is exposed.

In accordance with various embodiments of the present invention, an apparatus comprises a substrate comprising multiple cells, where each cell comprises at least one emitter within an emitter layer. The apparatus further comprises a heater trench adjacent to the emitter layer. The heater trench has a width that extends over at least respective portions of two cells.

In accordance with various embodiments, the apparatus further comprises heater elements within the heater trench. A heater element is adjacent the at least one emitter and has a substantially L-shape.

In accordance with various embodiments of the present invention, each heater element comprises one of TiN or TaN.

In accordance with various embodiments, a top emitter interface is included on a memory cell. In accordance with various embodiments, the top emitter interface comprises tungsten. In accordance with further embodiments, the memory cell comprises GST.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide an ultra high density (UHD) phase change memory (PCM) apparatus and methods for fabricating the same.

Figure 1:
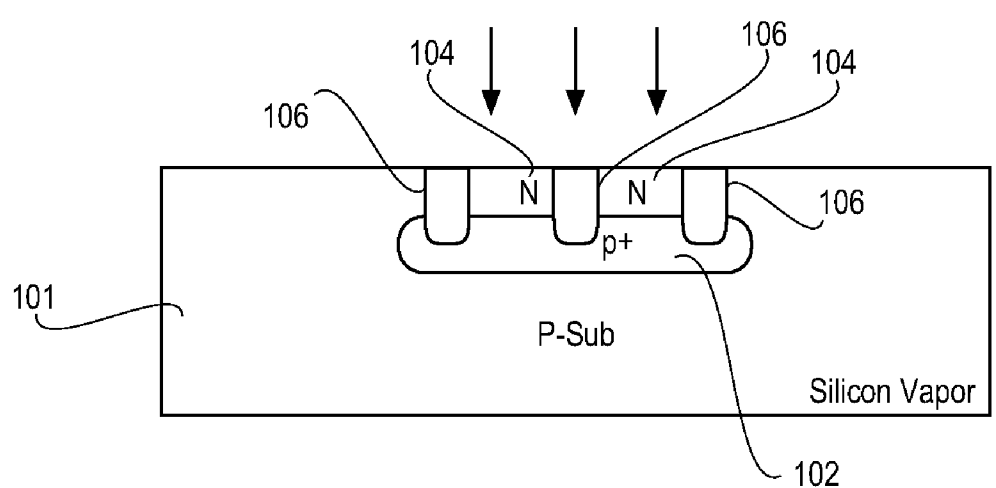
FIGS. 1-2 are cross sectional schematic views of a substrate after various operations, in accordance with various embodiments of the present invention.

Referring to FIG. 1, a memory cell area may be formed beginning with a memory cell area lithograph operation (Clear Tone Mask) that is performed on a silicon vapor substrate 101. A collector doping operation is performed to create a P+ collector region 102, followed by a base doping operation to create an N base region 104. Next, a shallow trench isolation (STI) lithographic operation is performed including etching and filling trenches 106 with oxide. This generally completes the memory cell area and thus, a chemical mechanical planarization (CMP) operation may be performed to smooth the various areas of the substrate 101.

Figure 2:
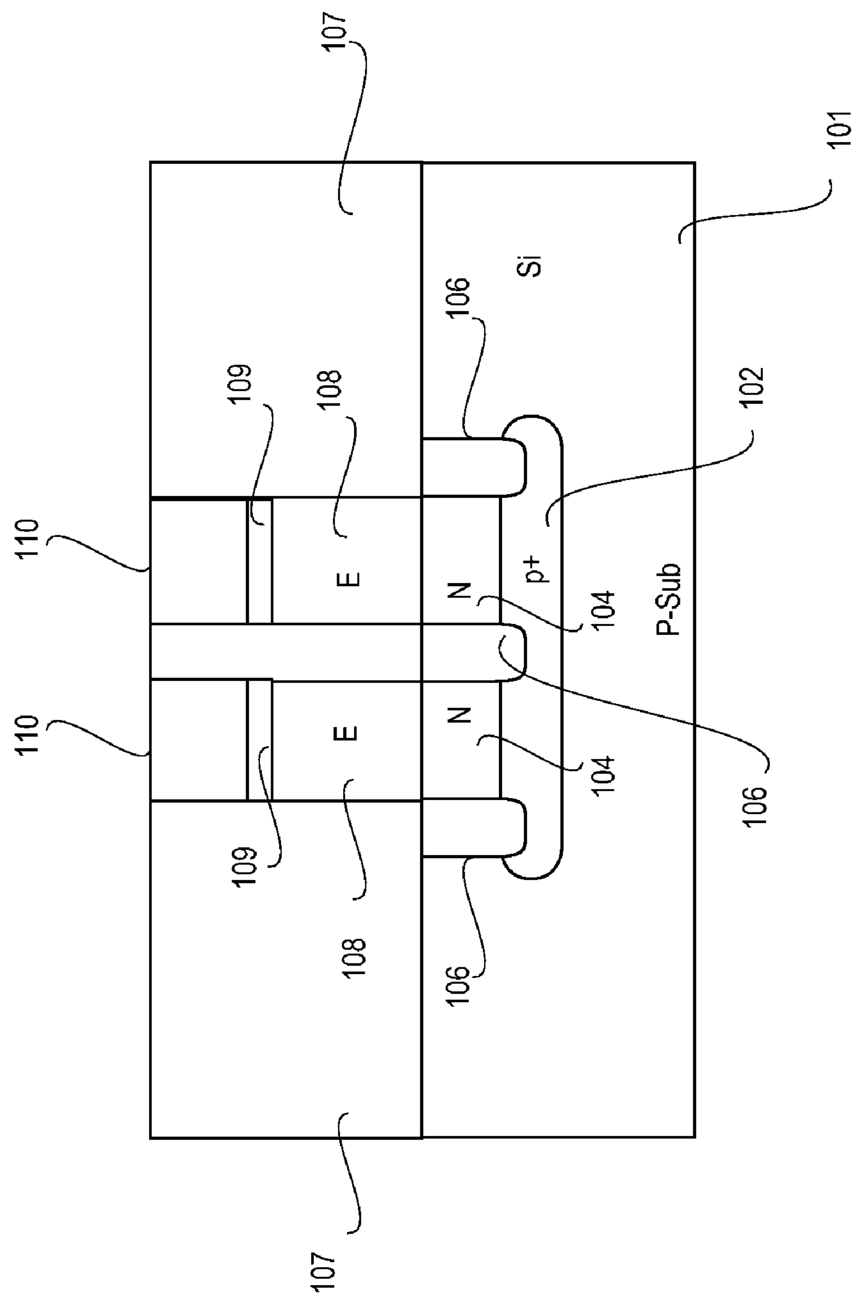

Referring to FIG. 2, an interlayer dielectric deposition (ILD) may then be performed with, for example, oxide, followed by an emitter lithographic formation. The area 100 may then be etched in order to open emitter areas (where the emitters 108 will subsequently be formed) and form ILD regions 107. High temperature silicon germanium (SiGe) is Epi (epitaxial) formed in the emitter areas in order to fill up the emitter areas with P+ SiGe and thereby form the emitters. If needed, a CMP operation may be performed to smooth the surface. In accordance with various embodiments, this Epi step may be skipped if desired and emitters 108 may simply be silicon.

A base lithographic operation may then be performed for memory area opening and ion metal plasma (IMP) is provided to the base 104. It is desirable to insure that the IMP N+ covers the base pick-up. This may be followed by another emitter lithographic operation and IMP to the emitters 108. This is done to help ensure that the base 104 and emitters 108 maintain the proper level of doping after the SiGe Epi formation.

In accordance with various embodiments of the present invention, a silicidation may be performed in order to deposit silicide at regions 109. The silicidation may include depositing a layer of, for example, nickel or cobalt. The layer is then etched resulting in regions 109. This may be skipped if emitters 108 are silicon as opposed to Epi grown SiGe. A metallization may be performed to place a protective layer 110 of metal, for example tungsten, on the silicide regions 109 or directly on emitters 108 if the silicidation is skipped.

In accordance with various embodiments of the present invention, an interlayer dielectric layer 112 may then be deposited. This layer 112 is then etched over the emitters 108 until the silicide layer 109 is reached (if included) or until the emitter 108 is reached (if the silicide layer is not included). A metallization step may then be performed to fill the etched trenches with a protective layer 110 of tungsten. A CMP may then be performed to smooth and flatten the tungsten and ILD layers 110, 112. A layer 116 of nitride ($Si_3N_4$) may be deposited and a CMP may be performed if needed.

Figure 3:
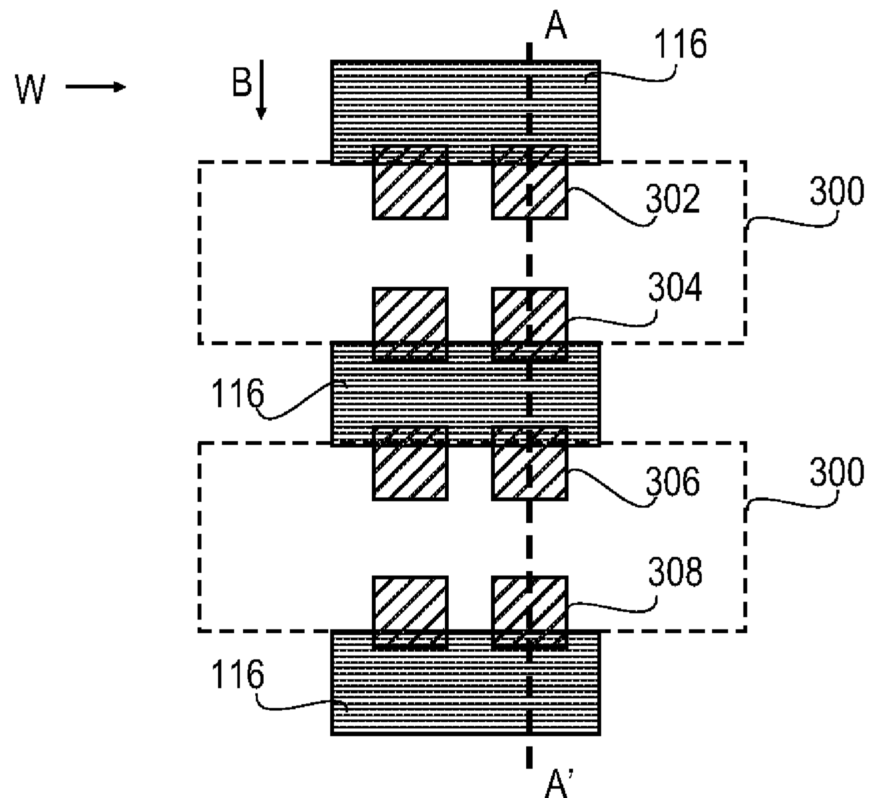
FIG. 3 is a top schematic view of the substrate illustrating a lithographic operation, in accordance with various embodiments of the present invention.
Figure 4:
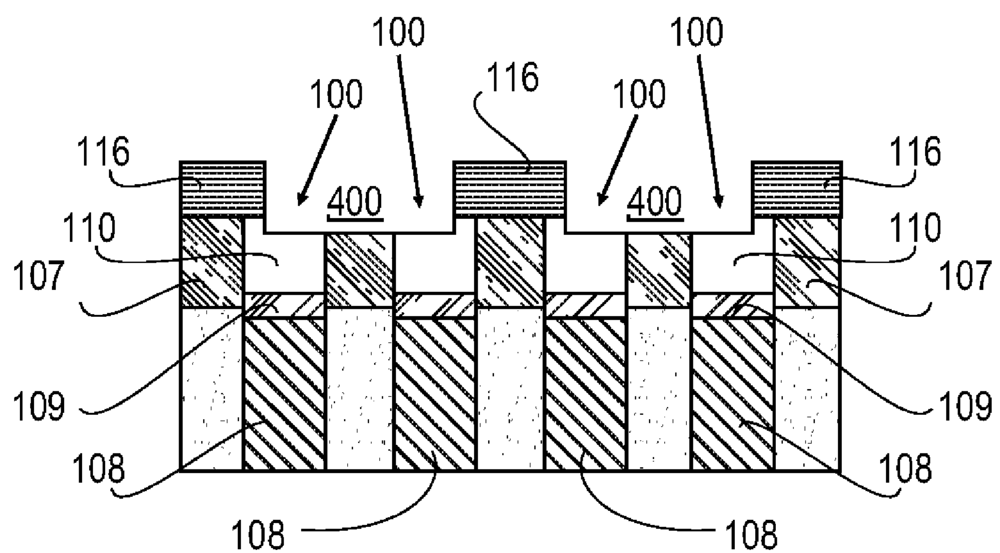
FIG. 4 is cross sectional schematic view of the substrate after the lithographic operation of FIG. 3, as seen along the line A-A' of FIG. 3, in accordance with various embodiments of the present invention.
Figure 5:
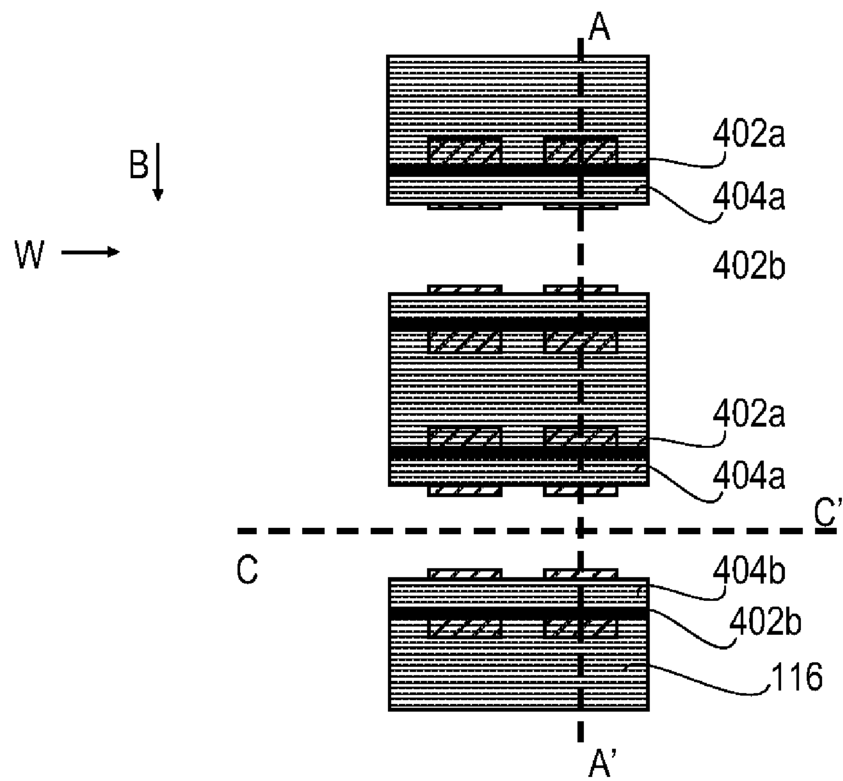
FIG. 5 is a top schematic view of the substrate illustrating lithographic operations, in accordance with various embodiments of the present invention.
Figure 6:
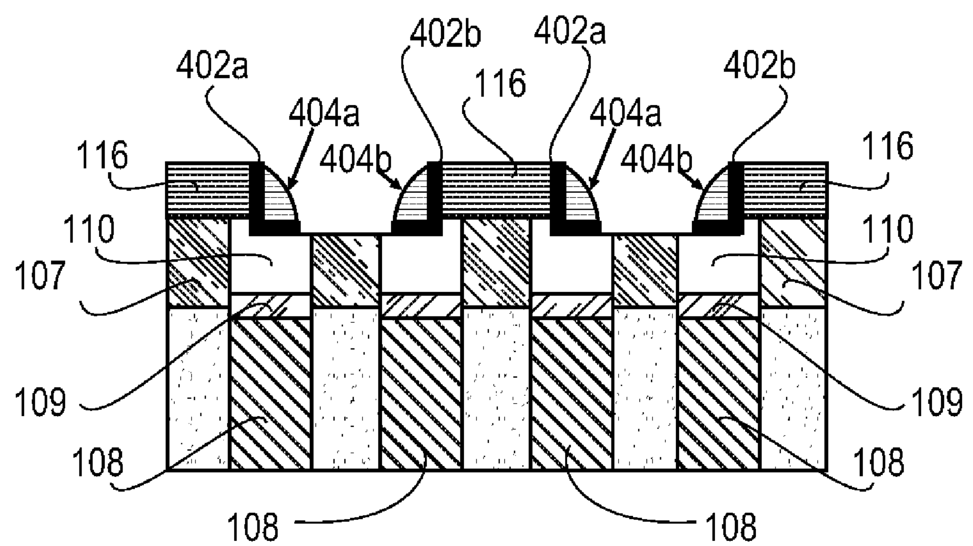
FIGS. 6-8 are cross sectional schematic views of the substrate after the lithographic operations of FIGS. 3 and 5, as seen along the line A-A' of FIG. 6, in accordance with various embodiments of the present invention.
Figure 7:
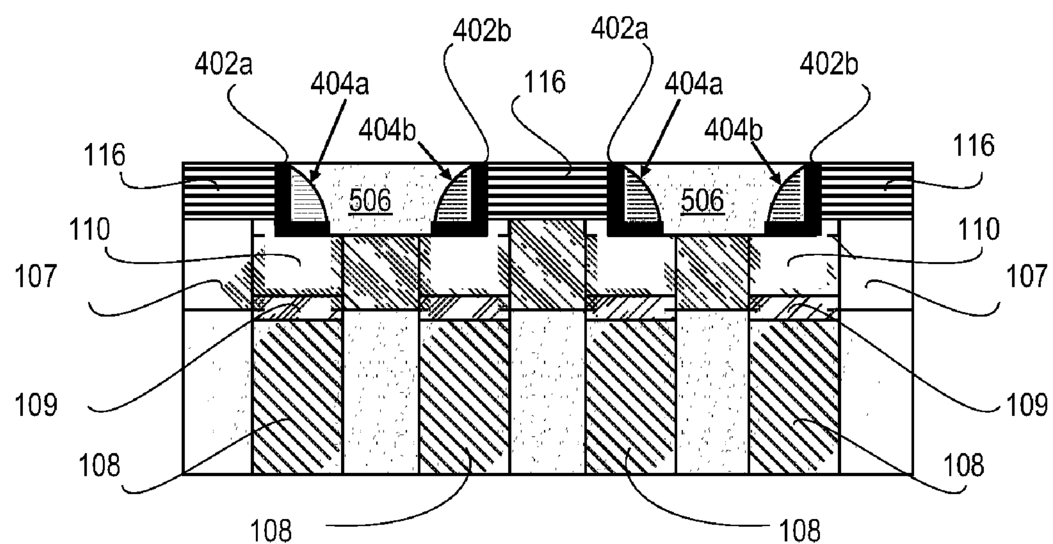
Figure 8:
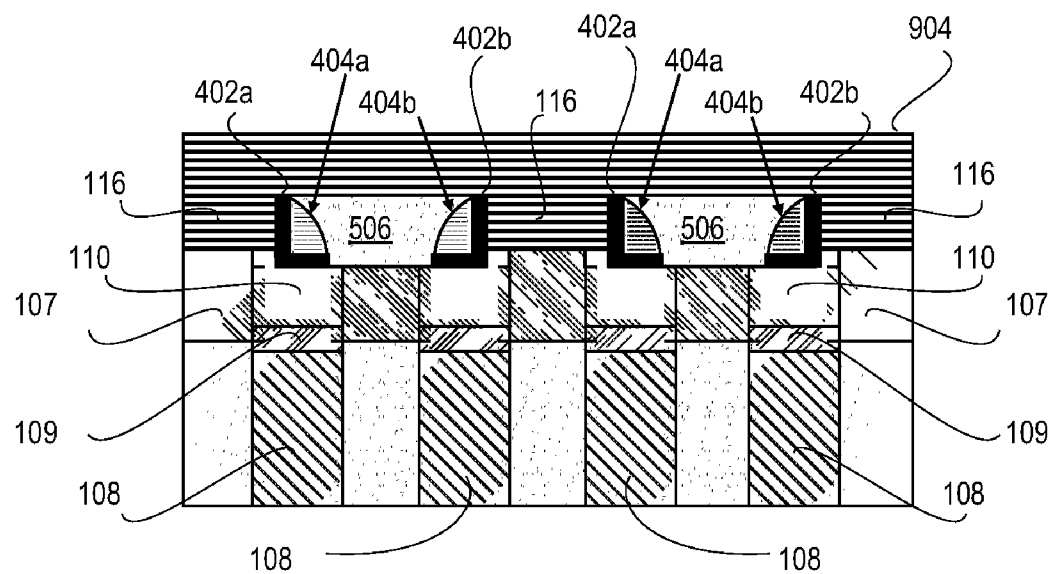

Referring to FIGS. 3 and 4, a lithographic operation 300 is performed, in accordance with various embodiments of the present invention. FIG. 3 is a top view of a wafer that includes multiple cells 100 that have been previously described. FIG. 4 is a cross-sectional view through four cells as seen along the line A-A'.

The lithographic operation 300 includes etching a heater trench 400 through the nitride layer 116. As may be seen in FIGS. 3 and 4, the heater trench extends across at least a portion of two cells. The heater trench 400 is etched such that it has a depth that extends into the tungsten and ILD layers 110, 112.

A layer of heater alloy, for example, TiN or TaN, may then be conformally deposited within the heater trenches. A layer of nitride is then deposited over the heater alloy layer.

As may be seen in FIG. 3, the lithographic operation 300 is illustrated as being performed in a word-line direction W across the wafer. Those skilled in the art will understand that the operation 301 may be performed in a bit-line direction B if desired.

Referring to FIGS. 5-8, an anisotropic etch of the heater trenches 400 is then performed. This removes portions of both the nitride and heater alloy layers that are planar, thus separating the heater alloy layer into two pieces 402*a*, 402*b*, as may be seen in FIG. 6. Thus, the heater alloy layer is now divided into two pre-heater element arrangements, where the pre-heater element arrangements also include nitride spacers 404*a*, 404*b*. In accordance with various embodiments, a layer 506 of oxide is deposited within the heater trenches 400. A CMP operation may then be performed to smooth the nitride and oxide layers 116, 506. The CMP process is performed until the vertical leg 403 of the heater alloy pieces 402*a*, 402*b* are exposed.

In accordance with various embodiments of the present invention, a lithographic operation is performed in the bit-line direction in order to cut across the pre-heater element arrangements to thereby form the heater alloy layers into heater elements. As may be seen in FIGS. 6-8, the heater elements 402*a*, 402*b* are substantially L-shaped. If the lithographic operation 300 was performed in the bit-line direction, then this second lithographic operation would be performed in the word-line direction across the wafer. A layer 904 of nitride may then be deposited.

Figure 9:
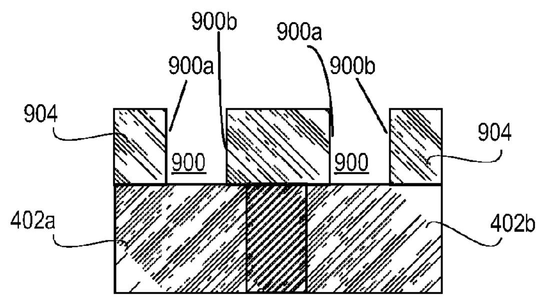
FIGS. 9-14 are cross sectional schematic views of the substrate, as seen along the line C-C' of FIG. 5, in accordance with various embodiments of the present invention.
Figure 10:
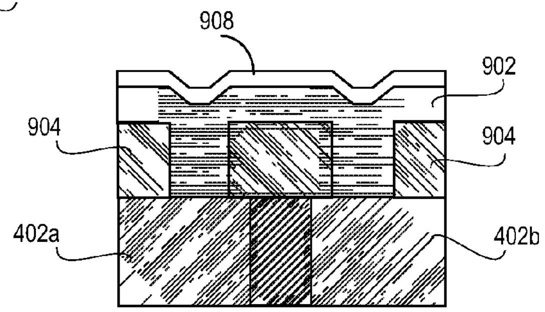
Figure 11:
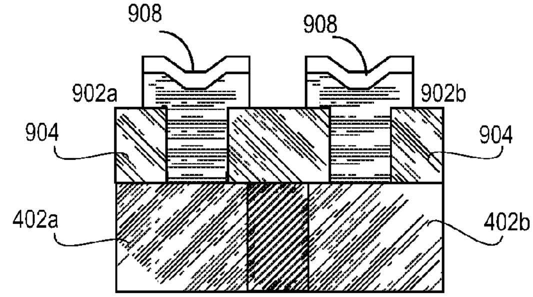

FIGS. 9-11, in accordance with various embodiments of the present invention, a lithographic operation in the bit-line direction B may be performed on the layer 904 of nitride in order to create a trench 900 and to expose the vertical leg of the heater elements 402*a*, 402*b* for contact with a PCM portion, which will serve as a memory cell. The resulting exposure of heating elements 402*a*, 402*b* within trench 900 is relatively small. Thus, contact of heating elements 402*a*, 402*b* with GST material 902 will be small. In accordance with various embodiments, the trench side walls 900*a*, 900*b* may be sloped.

In accordance with various embodiments, the PCM material is germanium antimony tellurium (GST) material that is conformally deposited within the trench 900. In accordance with various embodiments, a top electrode layer 908 may be deposited on top of the GST material. Examples of material for the top electrode layer 908 include Ti, Ta, TiN and TaN. An anisotropic etch is then performed, leaving a thin layer 902*a* of GST material on the side wall 900*a* of the trench 900. Nitride 906 may then be deposited into the trench to fill it up. Alternatively, an ILD may be performed in order to fill up the trench. A CMP is then performed to smooth the surface and to expose the GST material. If desired, the CMP process may be performed until a desired width of the GST material is exposed.

In accordance with various embodiments, a lithographic operation may be performed in the bit-line direction B on layers 902 and 908 in order to create GST columns. An anisotropic etch is then performed, leaving a thin layer 902*a* and 902*b* of GST material on the surface and inside the trench 900. A metallization may also be performed if desired to provide a protective layer of metal such as, for example, tungsten, over the top electrode 908. The protective layer may serve as a top emitter interface.

Figure 12:
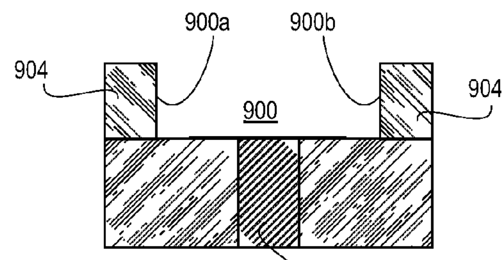
Figure 13:
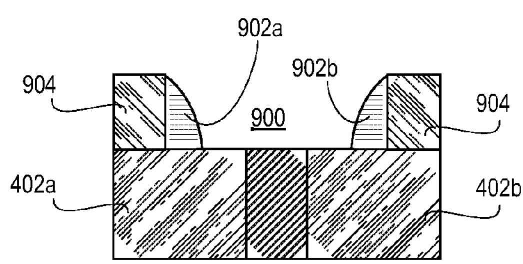
Figure 14:
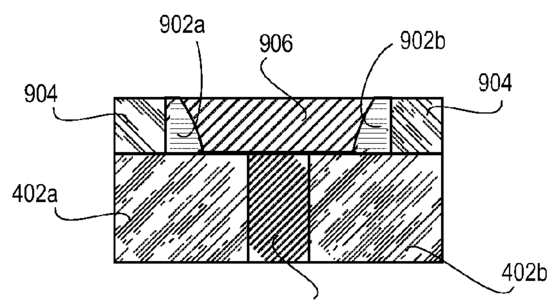

Referring to FIGS. 12-14, the trench 900 may be etched such that it extends across a portion of two cells and thus, exposes two adjacent heater element legs. A layer of GST material may then be conformally deposited within the trench and an anisotropic etch is performed leaving a thin layer 902*a*, 902*b* of GST material on each side wall 900*a*, 900*b* of the trench 900. As may be seen, each side wall 900*a*, 900*b* is adjacent an exposed leg of the heater elements 402*a*, 402*b*. A nitride layer 906 may then be deposited to fill up the trench between the two thin layers of the GST material or alternatively, an ILD may be performed in order to fill up the trench 900. A CMP process may then be performed to smooth the layers and expose the GST material 902*a*, 902*b*. A top electrode and protective layer may be provided on each GST portion if desired.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:

providing a wafer including multiple cells, each cell of the multiple cells including at least one emitter; and performing a lithographic operation on the wafer to form heater trenches adjacent the emitters, each heater trench having a width that extends over at least respective portions of two cells;

wherein performing the lithographic operation further comprises depositing a heater alloy layer within each heater trench, depositing a first nitride layer over the heater alloy layer, performing an anisotropic etching of the first nitride layer and the heater alloy layer, and depositing an oxide layer over the first nitride layer to form a pre-heater element arrangement within each heater trench.

2. The method of claim 1, wherein the lithographic operation is performed in a word line direction across the wafer.

3. The method of claim 1, wherein the lithographic operation is performed in a bit line direction across the wafer.

4. The method of claim 1, further comprising:

performing another lithographic operation on the wafer across the pre-heater arrangements to form two heater elements within each heater trench.

5. The method of claim 4, further comprising performing a third lithographic operation, wherein the third lithographic operation comprises:

depositing a second nitride layer over the heater elements, etching trenches within the second nitride layer, depositing germanium antimony tellurium (GST) material within the trenches, and performing an anisotropic etching of the GST material.

6. The method of claim 5, wherein each trench has a width that extends over at least a portion of one cell.

7. The method of claim 5, wherein each trench has a width that extends over at least respective portions of two cells.

8. The method of claim 5, further comprising forming a top emitter interface on the GST material for at least one emitter.

9. The method of claim 8, further comprising performing a metallization such that a metal protective layer is provided on a top surface of the top emitter interface.

10. The method of claim 9, wherein the metallization is performed with tungsten.

11. The method of claim 4, wherein each heater element comprises one of TiN or TaN.

* * * * *